United States Patent
Bickley et al.

[19]

[11] Patent Number: 5,822,687
[45] Date of Patent: Oct. 13, 1998

[54] METHOD AND APPARATUS FOR AUTOMATIC TUNING CALIBRATION OF ELECTRICALLY TUNED FILTERS

[75] Inventors: Robert Henry Bickley, Scottsdale; Michael Newton Pickett, Phoenix, both of Ariz.

[73] Assignee: Motorola, Inc., Schaumburg, Ill.

[21] Appl. No.: 110,233

[22] Filed: Aug. 23, 1993

Related U.S. Application Data

[63] Continuation of Ser. No. 787,172, Nov. 4, 1991, abandoned.

[51] Int. Cl.$^6$ .................................................. H04B 17/00
[52] U.S. Cl. ..................... 455/226.7; 455/266; 455/340
[58] Field of Search ............................... 455/340, 186.1, 455/338, 339, 183.1, 183.2, 254, 165.1, 185.1, 195.1, 226.1, 266, 67.1, 67.4; 333/16, 17.1

[56] References Cited

U.S. PATENT DOCUMENTS

| | | | |
|---|---|---|---|
| 4,334,323 | 6/1982 | Moore | 455/340 |
| 4,368,541 | 1/1983 | Evans | 455/340 |
| 4,685,150 | 8/1987 | Maier | 455/340 |
| 5,031,131 | 7/1991 | Mikos | 364/721 |
| 5,101,509 | 3/1992 | Lai | 455/340 |

*Primary Examiner*—Nguyen Vo
*Attorney, Agent, or Firm*—Jeffrey D. Nehr; Bradley J. Botsch

[57] ABSTRACT

A method and apparatus for automatic tuning calibration of electronically tuned filters which comprises a programmable frequency generator for producing a calibration frequency signal, a filter for filtering the calibration frequency signal, a detector for producing a detector voltage, a processor for programming the frequency generator to specific test frequencies and for producing a stepped filter tuning voltage and storing the detector voltage in response to the stepped filter tuning voltage, and a converter for digital-to-analog conversion of the stepped filter tuning voltage. Calibration frequency signal versus tuning voltage responses are stored for a number of calibration iterations within the usable range of the filter and the resulting table can be used to determine the correct tuning voltage for the filter when operating at any frequency within the usable filter range.

16 Claims, 4 Drawing Sheets

METHOD AND APPARATUS FOR AUTOMATIC TUNING CALIBRATION OF ELECTRICALLY TUNED FILTERS

This application is a continuation of prior application Ser. No. 07/787,172, filed Nov. 4, 1991, now abandoned.

BACKGROUND OF THE INVENTION

This invention relates in general to the field of tuning calibration, and in particular to the automatic tuning calibration of electronically tuned filters.

Electronically tuned radio frequency (RF) filters such as those implemented with varactors produce varying tuning characteristics, e.g., frequency versus voltage variations, that are a function of a number of variables. Varying tuning characteristics can arise from variability in component tolerances, printed wiring board dimensions and the dielectric constant of the board material, stray inductance and capacitance variations due to component and shield or ground plane placement.

Many equipment designs in which electronically tuned filters are used contain microprocessor controllers and non-volatile memory capability. Typical filter calibration techniques do not take advantage of these additional components in addressing the filter calibration problem in electronically tuned filters.

Among typical approaches used to calibrate electronically tuned filters are adjustable RF components used to "trim" the filter to track a predetermined tuning curve, adjustable or select-in-test components in an analog tracking circuit to interface a standard voltage versus frequency curve to the individual characteristics of the filter, and components with very accurate value tolerances. These techniques are expensive in terms of test labor required and/or component cost.

Another approach to address electronically tuned filter calibration is an active approach which measures the phase shift between an applied test signal and the filter output and which provides a unique null output indicating correct tuning of the filter. This active servo loop technique is relatively elaborate and more expensive, however, requiring several directional couplers and a phase detector and higher signal levels for proper operation as a result.

A need exists, therefore, for a method and apparatus for automatic tuning calibration of electronically tuned filters which requires relatively few components, is relatively inexpensive, and does not require adjustments at the factory. The approach should be applicable in RF equipment such as transmitters, receivers, or test equipment that require electronically tuned filters and include programmable RF sources and microprocessor-controlled systems. The approach should reduce the cost of the filters and provide precise tuning of very narrow bandwidth filters that might not otherwise be feasible due to the high tracking accuracy required.

SUMMARY OF THE INVENTION

Accordingly, it is an advantage of the present invention to provide a new and improved method and apparatus for automatic tuning calibration of electronically tuned filters which takes advantage of programmable RF sources and microprocessor-controlled systems. It is an additional advantage that the method and apparatus for automatic tuning calibration is generally applicable to transmitters, receivers, and/or test equipment, yet requires relatively few components and is relatively inexpensive. It is still further an advantage of the present invention the method and apparatus for automatic tuning calibration of electronically tuned filters provides precise tuning of very narrow bandwidth filters that might not otherwise be feasible due to the high tracking accuracy required.

To achieve these advantages, a method and apparatus for automatic tuning calibration of electronically tuned filters is contemplated which comprises a programmable frequency generator for producing a calibration frequency signal, a filter for filtering the calibration frequency signal, a detector for producing a detector voltage, a processor for programming the frequency generator to specific test frequencies and for producing a stepped filter tuning voltage and storing the detector voltage in response to the stepped filter tuning voltage, and a converter for digital-to-analog conversion of the stepped filter tuning voltage.

Calibration frequency signal versus tuning voltage responses are stored for a number of calibration iterations within the usable range of the filter. The calibration frequency signal versus tuning voltage table is then used to determine the correct tuning voltage for the filter for any frequency within the usable range of the filter.

The above and other features and advantages of the present invention will be better understood from the following detailed description taken in conjunction with the accompanying drawings.

DETAILED DESCRIPTION OF THE PREFERRED EMBODIMENT

Figure 1:
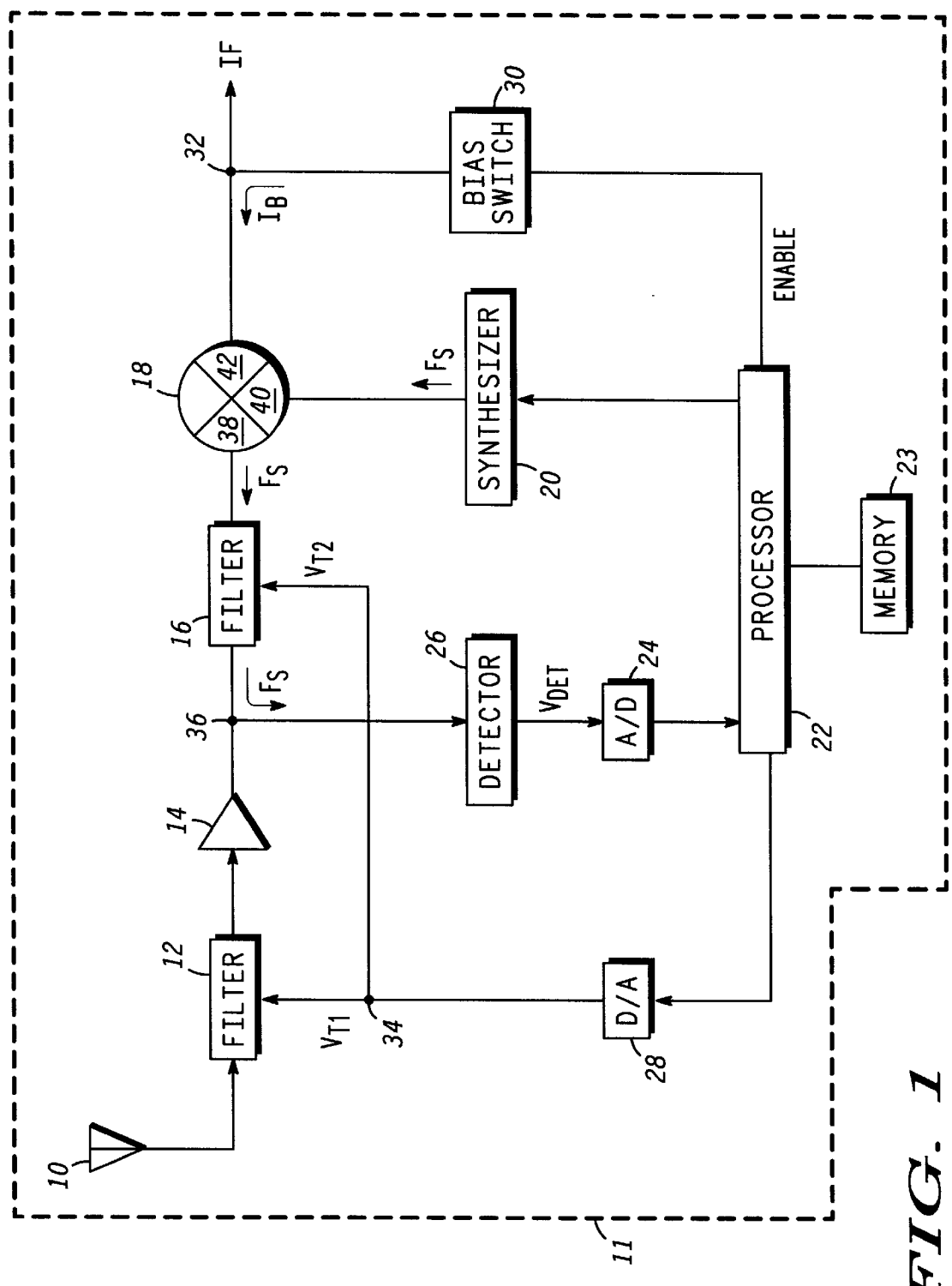
In FIG. 1, there is shown a schematic circuit diagram of a circuit for automatic tuning calibration of electronically tuned filters in a radio receiver in accordance with a preferred embodiment of the invention.

FIG. 1 illustrates schematically the diagram of a circuit for automatic tuning calibration of electronically tuned filters. The approach can be applied in RF equipment such as transmitters, receivers, or test equipment, i.e., any application using electronically tuned filters and possessing programmable RF sources and microprocessor controlled systems. The FIG. 1 application represents the method and apparatus applied to the radio receiver 11.

In FIG. 1, antenna 10 is coupled to filter 12. Filter 12 is coupled through amplifier 14 to junction 36. Junction 36 is coupled both through filter 16 to R port 38 of mixer 18 and through detector 26 to converter 24. Converter 24 is coupled to processor 22. Processor 22 is coupled through converter 28 to junction 34. Memory 23 is coupled to processor 22. Junction 34 is coupled to filter 12 and also to filter 16.

Processor 22 is also coupled through synthesizer 20 to L port 40 of mixer 18. Processor 22 is also coupled through bias switch 30 to junction 32. Junction 32 is coupled to the I port 42 of mixer 18. Junction 32 serves as the intermediate frequency (IF) output.

Filters 12 and 16 in the preferred embodiment are to be essentially identical filters. Filters 12 and 16 exhibiting identical performance characteristics allows the tuning calibration measurements to test filter 16, but apply the tuning voltages resulting from the tuning calibration measurements to the receiver filter 12. Should the filters not be identical, or it be desirable to characterize the tuning characteristics of filter 12 directly, filter 12 may be calibrated in a manner similar to the calibration of filter 16.

In operation, the FIG. 1 circuit automatically determines the correct tuning voltage for tuning the receiving tuning filter 12 in the following way. Processor 22 enables bias switch 30 to a bias (direct) current, i.e., $I_B$, through junction 32 to the I port 42 of diode balanced mixer 18. Mixer 18, responding to the bias current at the I port 42, connects R port 38 to L port 40 of mixer 18.

Processor 22 simultaneously executes a program using synthesizer 20 to generate a test signal, i.e., a synthesizer signal at frequency $F_S$. When R port 38 of mixer 18 is connected to L port 40 of mixer 18, test signal $F_S$ is input into filter 16. The test signal $F_S$ passes through filter 16 to junction 36, and then into detector 26.

Processor 22 transmits a digital tuning voltage to converter 28. Converter 28, a digital-to-analog converter, creates an analog tuning voltage signal from the digital tuning voltage of processor 28 and applies the analog tuning voltage $V_{T2}$ to junction 34 and, thus, to filter 16. At junction 34, the analog tuning voltage is also input into filter 12 as $V_{T1}$. The tuning voltages $V_{T1}$ and $V_{T2}$ are identical.

Filter 16 produces an output based on the synthesizer signal at frequency $F_S$ and the tuning voltage $V_{T2}$ input to filter 16. The filter 16 output is received by the detector 26, which produces a detected voltage, $V_{DET}$, in response.

Processor 22 sets the first synthesizer frequency, $F_{S1}$, to a first calibration frequency, i.e., the lowest filter frequency for both filters 12 and 16. While producing the fixed test signal, $F_{S1}$, processor 22 also produces the digital tuning voltage signal in steps. The stepped digital tuning voltage produces a range of analog tuning voltages from converter 28, which in turn produces a series of detected analog voltages, $V_{DET}$, from detector 26.

Figure 2:
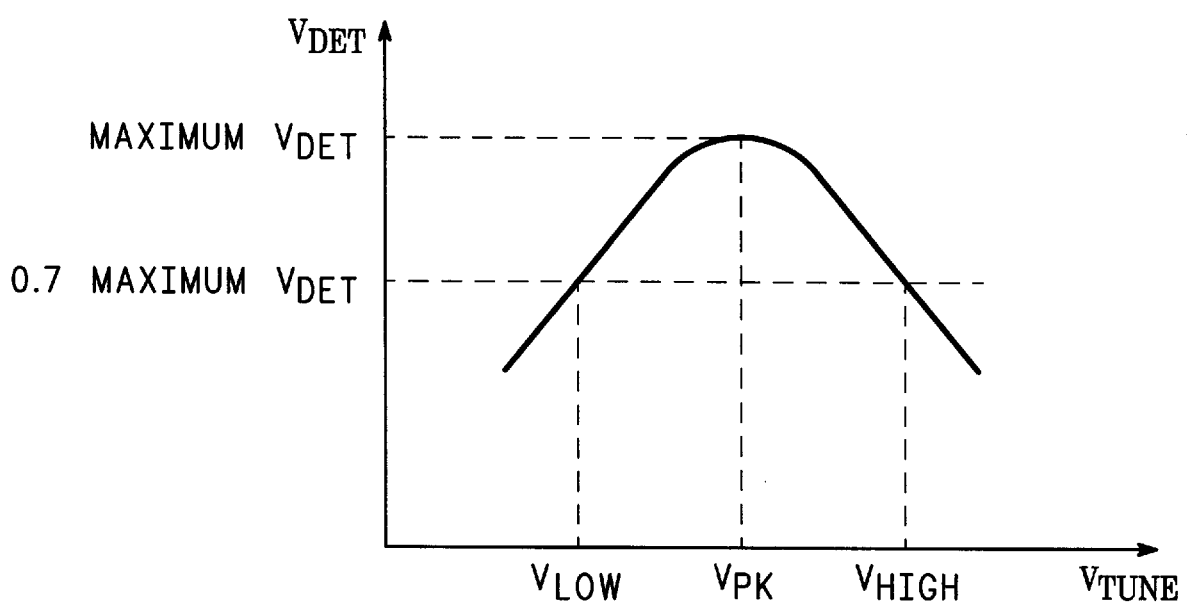
In FIG. 2, there is a representative graph of a detector voltage versus tuning voltage curve for a particular test signal (synthesizer frequency).

FIG. 2 illustrates what curve the detected voltage, $V_{DET}$, versus tuning voltage, $V_{T1}$ or $V_{T2}$, shown on the abscissa as $V_{TUNE}$, might trace for filter 12 or filter 16. The detected voltage rises as the tuning voltage is increased, reaches a relative local maximum, and decreases. The local maximum occurs when the tuning voltage $V_{TUNE}=V_{PK}$, and $V_{LOW}$ and $V_{HIGH}$ are defined as the tuning voltages giving rise to detector voltage values of $0.7V_{DET}$ maximum.

The FIG. 1 circuit processes the FIG. 2 information as follows. Processor 22, receiving a digital version of the detected voltage from detector 26 through converter 24, stores the detected voltage corresponding to each tuning step in the memory 23. The processor stores the tuning voltage corresponding to the maximum detected voltage as $V_{PK}$. Processor 22 continues to step the tuning voltage until the detected voltage drops below a value of $0.7V_{PK}$. This value was chosen for the preferred embodiment but can be chosen differently, depending on the desired application and effect, without affecting the operation of the automatic filter calibration method. Processor 22 stores the tuning voltage corresponding to $V_{DET}=0.7V_{PK}$ as $V_{HIGH}$ in memory 23. Processor 22 then examines previously stored detector voltages from tuning voltages less than $V_{PK}$ and defines the tuning voltage that precedes the first step where $V_{DET}$ was greater or equal to $0.7V_{PK}$ as $V_{LOW}$. $V_{LOW}$ is also stored in memory 23.

Processor 22 in this preferred embodiment using a relatively narrow bandwidth filter then calculates the correct tuning voltage for frequency $F_{S1}$ using the equation:

$$V_{TSi}=(V_{LOW}-V_{HIGH})/2+V_{CORR} \quad \text{(Equation 1)}$$

where i=1. $V_{CORR}$ is an empirical correction factor from a look-up table stored in memory 23, and represents a tuning voltage correction based on the particular filter shape and filter center frequency used. The use of $V_{CORR}$ allows the processor 22 to set a tuning voltage slightly off the passband center frequency to optimize for other considerations, such as stopband symmetry or maximum high side or low side rejection, etc., if so desired. The processor 22 stores $V_{TS1}$ as the correct tuning voltage at frequency $F_{S1}$. (Depending on how narrow the band of filter 12 or 16, processor 22 could also calculate the tuning voltage using another algorithm, e.g., as the geometric mean of $V_{LO}$ and $V_{HIGH}$.)

Processor 22 sets a next calibration frequency, $F_{S2}$, i.e., a step up from the lowest filter frequency for both filters 12 and 16. While the synthesizer produces the fixed test signal, $F_{S2}$, processor 22 also produces the digital tuning voltage in steps. The stepped digital tuning voltage produces a range of analog tuning voltages from converter 28, which in turn produces another series of detected analog voltages, $V_{DET}$, from detector 26 for the second test signal, $F_{S2}$. In the same manner described for determining $V_{PK}$, $V_{LOW}$, and $V_{HIGH}$ for the first test signal, $F_{S1}$, new $V_{PK}$, $V_{LOW}$, and $V_{HIGH}$ values are generated for $F_{S2}$ by processor 22 and stored in memory 23.

The same calibration process is repeated for test signals $F_{S3}$ through $F_{SN}$, with $F_{SN}$ being the highest usable frequency of the filters 12 and 16. The number of calibration iterations, N, can be varied, depending on the tuning range and the linearity of the responses of filters 12 and 16 over that range. A correct tuning voltage, $V_{TSi}$, is therefore generated and stored for each test signal $F_{Si}$ throughout the usable frequencies of filters 12 and 16.

The list, or table, of correct tuning voltages versus frequency stored in memory 23 can be used to calibrate filter 16 when operated as a receiver filter in FIG. 1. The antenna in FIG. 1 receives an external signal which is transmitted to filter 12. The correct tuning voltage for any operating frequency $F_X$ within the operational frequency limits of filter 12, i.e., from $F_{S1}$ to $F_{SN}$, is calculated by linear interpolation by processor 22 using the two tuning voltage calibration points closest in frequency to $F_X$.

Figure 3A:
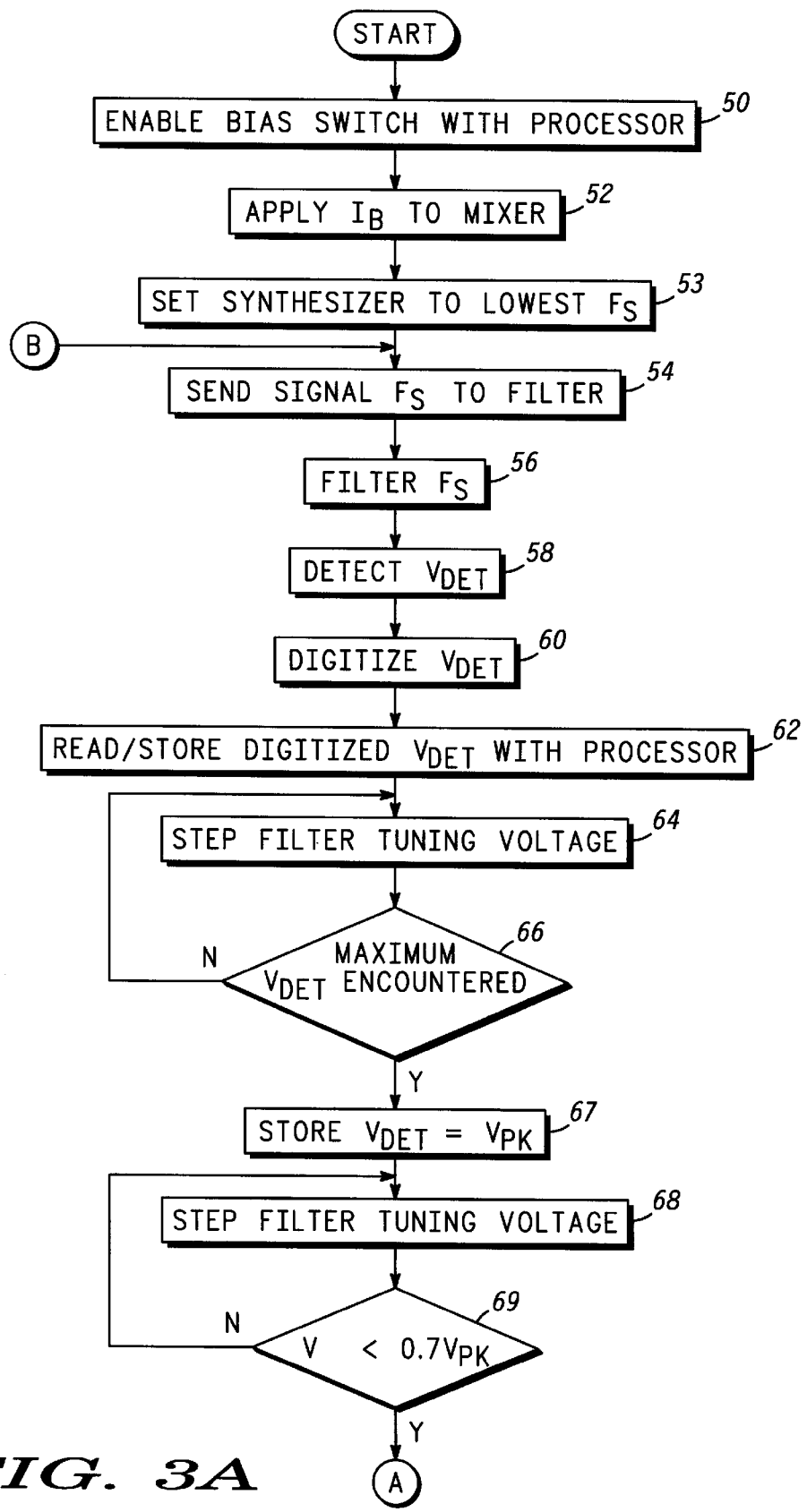
In FIGS. 3A and 3B, there is a flowchart representation of a method of automatic tuning calibration of electronically tuned filters in accordance with a preferred embodiment of the invention.
Figure 3B:
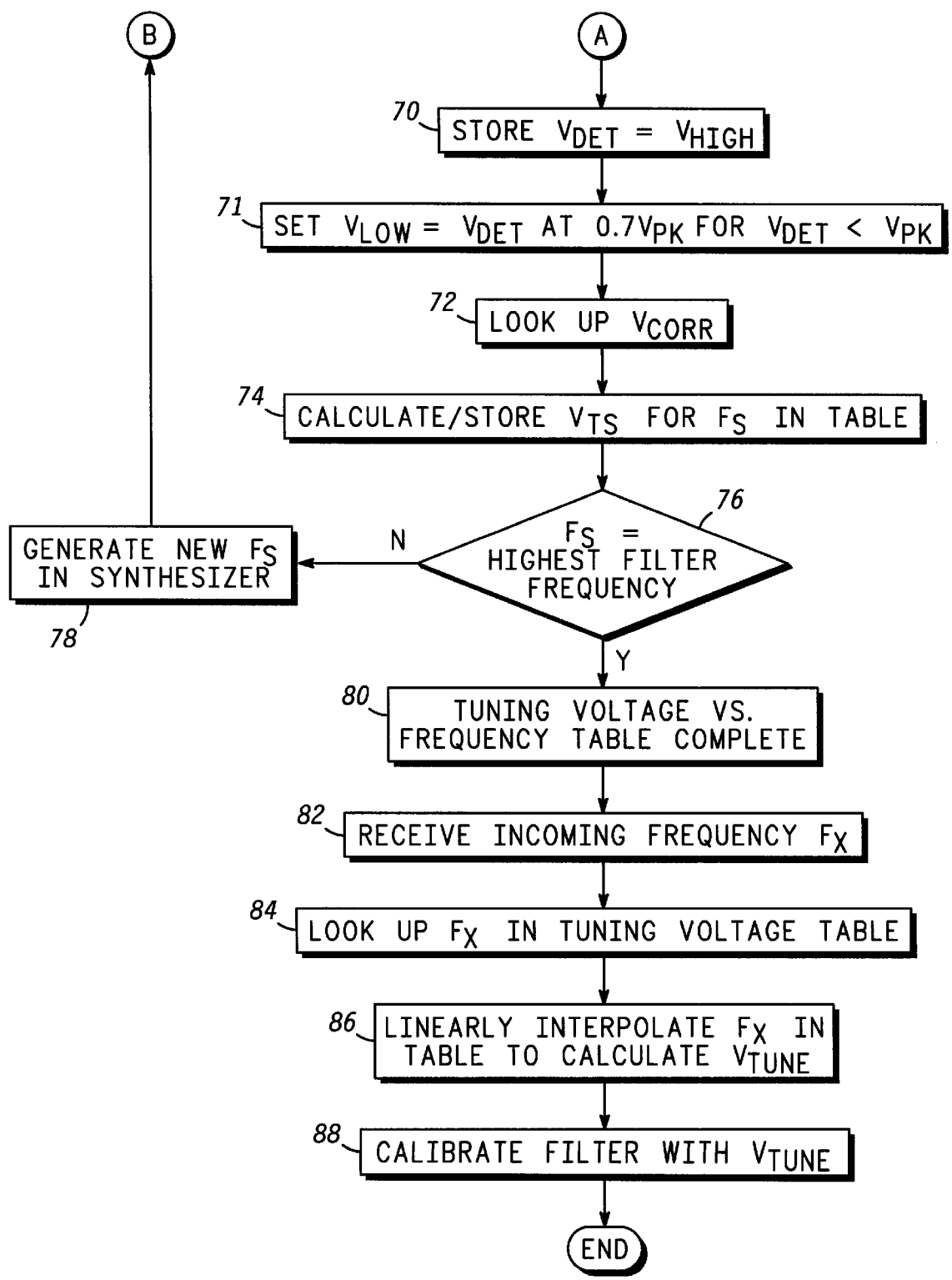

FIG. 3 illustrates the automatic filter tuning approach method applying to the circuit in FIG. 1. The bias switch 30 is enabled by the processor 22, as shown in box 50 of FIG. 3. The bias current $I_B$ is applied to mixer 18, as shown in box 52. Synthesizer 20 is programmed by processor 22 to produce a signal at the lowest usable frequency of filters 12 and 16. Synthesizer 20 produces a signal at frequency $F_S$, illustrated in box 53. The synthesizer signal at frequency $F_S$ is transmitted to filter 16, as shown in box 54. Box 56 of FIG. 3 shows the filtering of the synthesizer signal, and boxes 58 and 60 describe detection and digitization, respectively, of the resulting detector voltage.

Processor 22 reads and stores the digitized detector voltage $V_{DET}$, as shown in box 62. Processor 22 also steps the tuning voltage to filter 16, as shown in box 64. If the detector voltage read for the current tuning voltage step is not the maximum detector voltage, box 66 transfers control to box 64 via the NO path and the system continues to step the filter tuning voltage to find the maximum voltage. If the detector voltage read for the current tuning voltage step is the maximum detector voltage, that maximum value is stored in the memory 23 as $V_{PK}$, as shown by box 66 transferring control to box 67, proceeding on the YES path.

In box 68, the filter tuning voltage continues to be stepped to locate $V_{HIGH}$, which is the tuning voltage for which the detected voltage has decreased from $V_{PK}$ to $0.7V_{PK}$. If the detected voltage $V_{DET}$ is not $V_{HIGH}$, control is transferred from box 69 to box 68 via the NO path and the system continues stepping the tuning voltage. If, however, the current $V_{DET}$ is equal to $V_{HIGH}$, then via the YES path, box 69 is taken to box 70 and $V_{DET}$ is stored in memory 23 as $V_{HIGH}$, as shown in box 70.

$V_{LOW}$ is determined by the processor 22 comparing previously stored $V_{DET}$ values in memory 23 with $V_{PK}$. $V_{LOW}$ is set equal to the tuning voltage that precedes the first tuning voltage step where $V_{DET}$ was greater or equal to $0.7V_{PK}$, as shown in box 71.

The empirical correction factor $V_{CORR}$ is read from the memory 23 as shown in box 72, and, as shown in box 74, processor 22 calculates and stores the tuning voltage value for the particular synthesizer frequency $F_{Si}$ using equation 1.

If the current $F_S$ is not the highest usable filter 16 frequency, control is transferred from box 76 via the NO path to box 78 where a new synthesizer frequency $F_S$ is generated. Control is transferred to box 54, and the $F_S$ signal at the new synthesizer frequency is sent to filter 16. The system repeats e steps shown in the flowchart boxes to calculate the tuning voltage $V_{TS}$ for the new $F_S$.

If $F_S$ is the highest usable filter 16 frequency, control is transferred from box 76 to box 80 via the YES path, and the tuning voltage versus frequency table is complete and stored in memory 23. For any operational frequency $F_X$ as shown in box 82, $F_X$ can be looked up in the tuning voltage table, as shown in box 84. As shown in box 86, linear interpolation can be used to locate the proper tuning voltage for $F_X$ between any two frequency values in the table. The tuning voltage corresponding to the operating frequency $F_X$ can then be used to calibrate filter 16 (or filter 12), as shown in box 88. The process is complete.

Thus, there has been described a method and apparatus for automatic tuning calibration of electronically tuned filters which overcomes specific problems and accomplishes certain advantages relative to prior art methods and mechanisms. The improvements are significant. The method and apparatus for automatic tuning calibration of electronically tuned filters requires relatively few components, is relatively inexpensive, and does not require adjustments at the factory. The approach is applicable to RF equipment such as transmitters, receivers, or test equipment that require electronically tuned filters and possess programmable RF sources and microprocessor-controlled systems. The approach reduces the cost of the filters and provides precise tuning of very narrow bandwidth filters that might not otherwise be feasible due to the high tracking accuracy required.

Thus, there has also been provided, in accordance with an embodiment of the invention, a method and apparatus for automatic tuning calibration of electronically tuned filters which overcomes specific problems and accomplishes certain advantages and which fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. An automatic tuning calibrator for electronically tuned filters comprising:

synthesizer means for producing a calibration frequency signal;

mixer means for receiving the calibration frequency signal, the mixer means coupled to the synthesizer means;

bias switch means for enabling the mixer means, the bias switch means coupled to the mixer means;

filter means for producing a filtered calibration frequency signal from the calibration frequency signal, the filter means coupled to the mixer means;

detector means for producing a detector voltage from the filtered calibration frequency signal, the detector means coupled to the filter means;

processor means for enabling the bias switch means for calibration, for producing a stepped filter tuning voltage and for storing the detector voltage in response to the stepped filter tuning voltage, the processor means coupled to the bias switch means, to the detector means and to the synthesizer means; and converter means for receiving the stepped filter tuning voltage and for providing digital-to-analog conversion of the stepped filter tuning voltage for input to the filter means, the converter means coupled to the processor means and to the filter means.

2. An automatic tuning calibrator as claimed in claim 1, wherein the detector means comprises:

analog voltage detector means for detecting the filtered calibration frequency signal and for producing an analog detector voltage output, wherein the analog voltage detector means is coupled to the filter means; and analog-to-digital converter means for producing a digitized detector voltage output from the analog detector voltage output, wherein the analog-to-digital converter means coupled to the analog voltage detector means and to the processor means.

3. An automatic tuning calibrator as claimed in claim 2, wherein the processor means comprises:

storage means for recording the digitized detector voltage output; and microprocessor means for enabling the bias switch means, for programming the synthesizer means, for producing the stepped filter tuning voltage, and for determining a calculated tuning voltage from the detector voltage, wherein the microprocessor means is coupled to the storage means for storing and retrieving the detector voltage.

4. An automatic tuning calibrator as claimed in claim 3, wherein the storage means comprises non-volatile memory.

5. An automatic tuning calibrator for tuning electronically tuned filters in a radio receiver, the automatic tuning calibrator comprising:

synthesizer means for producing a calibration frequency signal;

mixer means coupled to the synthesizer means for receiving the calibration frequency signal;

bias switch means for enabling the mixer means, the bias switch means coupled to the mixer means;

first filter means for producing a filtered calibration frequency signal from the calibration frequency signal, the first filter means coupled to the mixer means;

detector means for producing a detector voltage from the filtered calibration frequency signal, the detector means coupled to the first filter means;

processor means for enabling the bias switch means for calibration, for producing a stepped filter tuning voltage and for storing the detector voltage in response to the stepped filter tuning voltage, the processor means coupled to the bias switch means, to the detector means and to the synthesizer means; and converter means for receiving the stepped filter tuning voltage and for providing digital-to-analog conversion of the stepped filter tuning voltage for input to the filter means, the converter means coupled to the processor means and to the filter means; and radio receiver means for receiving an operating frequency signal, the radio receiver means coupled to the first filter means, to the detector means, and to the converter means.

6. An automatic tuning calibrator as claimed in claim 5, wherein the detector means comprises:

analog voltage detector means for detecting the filtered calibration frequency signal and for producing an analog voltage output, wherein the analog voltage detector means is coupled to the first filter means; and analog-to-digital converter means for producing a digitized detector voltage output from the analog voltage output, wherein the analog-to-digital converter means is coupled to the analog voltage detector means and to the processor means.

7. An automatic tuning calibrator as claimed in claim 6, wherein the processor means comprises:

storage means for recording the detector voltage; and microprocessor means for enabling the bias switch means, for programming the synthesizer means, for producing a stepped filter tuning voltage, and for determining a calculated tuning voltage from the detector voltage, wherein the microprocessor means is coupled to the storage means.

8. An automatic tuning calibrator as claimed in claim 7, wherein the storage means comprises non-volatile memory.

9. An automatic tuning calibrator as claimed in claim 5, wherein the radio receiver means comprises:

antenna means for receiving the operating frequency signal;

second filter means for producing a filtered operating frequency signal from the operating frequency signal, the second filter means coupled to the antenna means and to the converter means; and amplifier means for amplifying the filtered operating frequency signal from the second filter means for output to the detector means, the amplifier means coupled to the second filter means, to the first filter means, and to the detector means.

10. A method for automatic tuning calibration of electronically tuned filters comprising the steps of:

producing a calibration frequency signal in a programmable frequency generator including:
  enabling a bias switch with a microprocessor;
  producing a fixed frequency signal in a synthesizer; and
  enabling the mixer with the bias switch during calibration;

producing a filtered calibration frequency signal from the calibration frequency signal in a first filter;

producing a detector voltage in a detector from the filtered calibration frequency signal;

producing a stepped filter tuning voltage in a processor;

storing the detector voltage in response to the stepped filter tuning voltage in the processor;

calculating a filter tuning voltage from the detector voltage in the processor;

converting the stepped filter tuning voltage to a filter tuning voltage in a converter;

providing a radio receiver filter substantially identical in performance to the first filter; and calibrating the radio receiver filter with the filter tuning voltage.

11. A method for automatic tuning calibration as claimed in claim 10, wherein the steps of producing the calibration frequency signal, producing the filtered calibration frequency signal, producing the detector voltage, producing the stepped filter tuning voltage, storing the detector voltage, calculating the filter tuning voltage, converting the stepped filter tuning voltage, and calibrating the radio receiver are repeated.

12. A method for automatic tuning calibration as claimed in claim 10, wherein the step of producing the detector voltage comprises the steps of:

detecting the filtered calibration frequency signal in an analog voltage detector;

producing an analog voltage in the analog voltage detector; and producing the detector voltage from an analog-to-digital converter.

13. A method for automatic tuning calibration as claimed in claim 10, wherein the step of storing the detector voltage comprises the step of recording the detector voltage in a table in non-volatile memory.

14. A method for automatic tuning calibration as claimed in claim 10, wherein the step of calibrating the radio receiver filter comprises the steps of:

receiving an operating frequency signal by an antenna;

producing a filtered operating frequency signal by the radio receiver filter;

amplifying the filtered operating frequency signal by an amplifier;

processing by the processor the filtered operating frequency signal to produce the filter tuning voltage for the radio receiver filter; and applying the filter tuning voltage from the processor to the radio receiver filter.

15. A method for automatic tuning calibration as claimed in claim 14, wherein the step of processing by the processor the filtered operating frequency signal comprises the steps of:

looking up by the processor the filtered operating frequency signal in a table;

linearly interpolating by the processor the filter tuning voltage associated with the filtered operating frequency signal; and producing the filter tuning voltage by the processor.

16. A method for automatic tuning calibration as claimed in claim 14, wherein the step of processing by the processor the filtered operating frequency signal further comprises the step of empirically correcting the filter tuning voltage for a filter shape.

* * * * *